(12) United States Patent
Peng

US006836167B2

(10) Patent No.: US 6,836,167 B2
(45) Date of Patent: Dec. 28, 2004

(54) TECHNIQUES TO CONTROL SIGNAL PHASE

(75) Inventor: Kathy L. Peng, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/198,579

(22) Filed: Jul. 17, 2002

(65) Prior Publication Data

US 2004/0012424 A1 Jan. 22, 2004

(51) Int. Cl.[7] ................................................ H03L 7/00
(52) U.S. Cl. .................... 327/163; 327/157; 327/162; 327/294; 327/299
(58) Field of Search ................................ 327/105, 113, 327/114, 141, 144–150, 154–158, 162–164, 291–294, 297, 298, 159, 172–175, 236, 244, 261, 3, 5, 7, 12, 16, 17, 27; 331/1 R, 1 A, 18, 55, 11, 14, 25; 365/233, 233.5; 375/374, 375, 376

(56) References Cited

U.S. PATENT DOCUMENTS

| | | | | |
|---|---|---|---|---|
| 5,239,561 A | * | 8/1993 | Wong et al. | 375/81 |
| 5,295,079 A | * | 3/1994 | Wong et al. | 364/484 |
| 5,448,598 A | * | 9/1995 | Yousefi et al. | 375/376 |
| 5,477,177 A | * | 12/1995 | Wong et al. | 327/156 |
| 5,497,126 A | * | 3/1996 | Kosiec et al. | 331/1 A |
| 5,799,048 A | * | 8/1998 | Farjad-Rad et al. | 375/360 |
| 5,828,250 A | * | 10/1998 | Konno | 327/116 |
| 5,910,753 A | * | 6/1999 | Bogdan | 331/17 |
| 5,991,350 A | * | 11/1999 | Yamamoto | 375/376 |
| 6,020,773 A | * | 2/2000 | Kan et al. | 327/271 |
| 6,049,255 A | * | 4/2000 | Hagberg et al. | 331/17 |
| 6,178,215 B1 | * | 1/2001 | Zhang et al. | 375/371 |
| 6,198,353 B1 | * | 3/2001 | Janesch et al. | 331/16 |
| 6,356,158 B1 | * | 3/2002 | Lesea | 331/11 |
| 6,389,090 B2 | * | 5/2002 | Zortea et al. | 375/374 |
| 6,396,788 B1 | * | 5/2002 | Feyh et al. | 369/59.2 |
| 6,456,165 B1 | * | 9/2002 | Kelkar | 331/17 |
| 6,466,058 B1 | * | 10/2002 | Goldman | 327/49 |
| 6,498,537 B1 | * | 12/2002 | Watanabe | 331/25 |
| 6,526,109 B1 | * | 2/2003 | Chang et al. | 375/371 |
| 6,545,547 B2 | * | 4/2003 | Fridi et al. | 331/16 |
| 6,646,512 B2 | * | 11/2003 | Abassi et al. | 331/17 |
| 6,667,640 B2 | * | 12/2003 | Asano | 327/147 |

* cited by examiner

Primary Examiner—Timothy P. Callahan
Assistant Examiner—Hai L. Nguyen
(74) Attorney, Agent, or Firm—Glen B. Choi

(57) ABSTRACT

A phase locked loop that may use UP and/or DN signals having programmable active state durations to control the speed of a clock signal.

16 Claims, 5 Drawing Sheets

TECHNIQUES TO CONTROL SIGNAL PHASE

1. Field

The subject matter herein generally relates to the field of phase locked loops.

2. Description of Related Art

Phase locked loop (PLL) devices can be used to match the phase of a clock signal with that of an input signal. FIG. 1 depicts an example PLL device. The clock generator 110 outputs a clock signal (shown as CLK). A phase comparator 120 compares the phase of an input signal (shown as INPUT) with that of signal CLK. The phase comparator 120 may output an UP or a DN pulse. The UP and DN pulses may control the charge pump 130. When signal CLK is behind the signal INPUT, phase comparator 120 outputs an UP pulse to charge pump 130 to instruct the charge pump 130 to provide more charge to the clock generator 110 to increase the speed of the signal CLK (over time) to match the phase of CLK with that of INPUT. Conversely, when the signal CLK is ahead of the signal INPUT, phase comparator 120 outputs a DN pulse to charge pump 130 to instruct charge pump 130 to remove charge from the clock generator 110 to decrease the speed of the signal CLK (over time). The charge pump 130 may add or remove an amount of charge in proportion to the width of respective UP and DN pulses.

Phase comparator 120 may output UP and DN pulses having fixed duration active states. For example, FIG. 2 depicts sample waveforms of UP and DN pulses having fixed duration active states. Use of fixed width UP and DN pulses may not accurately match the phase of the signal CLK with that of the signal INPUT.

BRIEF DESCRIPTION OF THE DRAWINGS

Note that use of the same reference numbers in different figures indicates the same or like elements.

DETAILED DESCRIPTION

Figure 3:
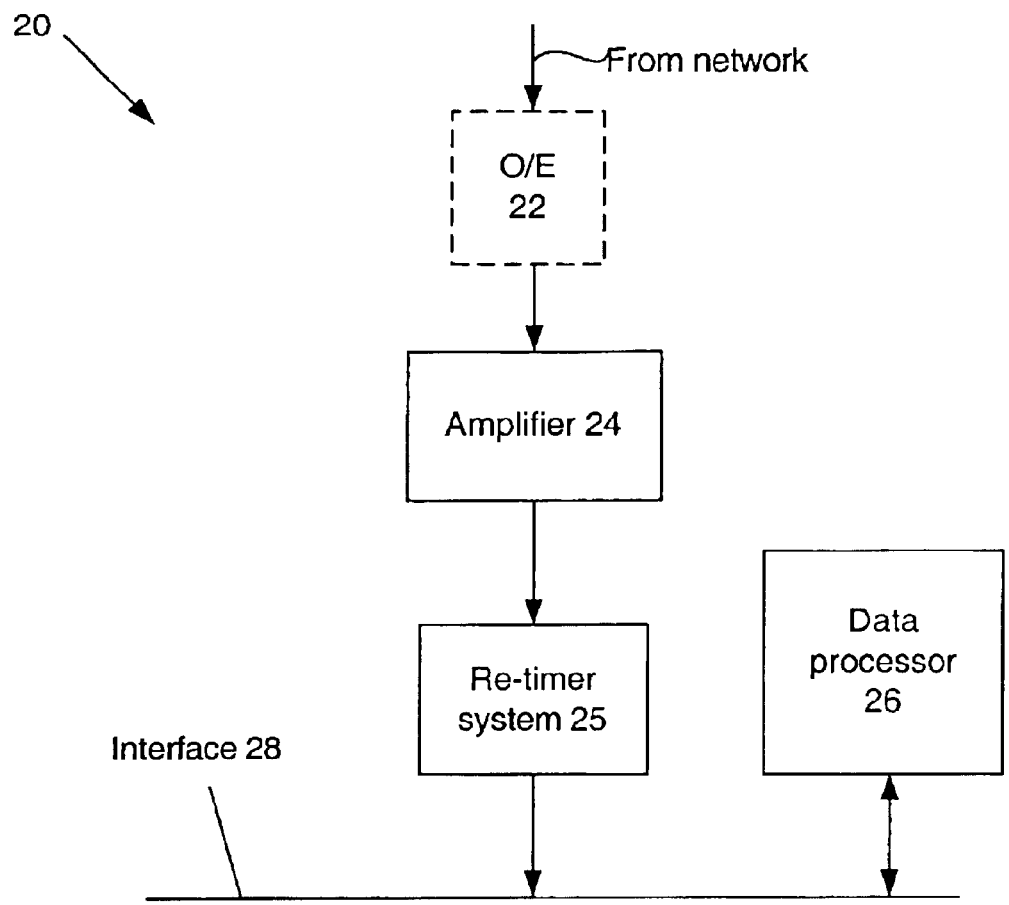
FIG. 3 depicts an example of a receiver system in which some embodiments of the present invention may be used.

Some embodiments of the present invention may be used where phase locked loops are used. For example, FIG. 3 depicts an example of a receiver system 20 that may use some embodiments of the present invention. Some implementations of receiver system 20 may use an optical-to-electrical converter ("O/E") 22 to receive optical signals from an optical network and convert optical signals into electrical signals. Amplifier 24 may amplify electrical signals received from O/E 22. Although reference has been made to optical signals, the receiver 20 may, in addition or alternatively, receive electrical signals from an electrical signal network. Re-timer system 25 may regenerate data and clock signals transmitted by the electrical signals. For example re-timer system 25 may use a phase locked loop. With respect to data and/or clock signals provided by re-timer system 25, data processor 26 may perform media access control (MAC) management in compliance for example with Ethernet, described for example in versions of IEEE 802.3; optical transport network (OTN) de-framing and de-wrapping in compliance for example with ITU-T G.709; forward error correction (FEC) processing, in accordance with ITU-T G.975; and/or other layer 2 processing. Interface 28 may provide intercommunication between data processor 26 and other devices such as a microprocessor, memory devices, and/or a switch fabric (not depicted). Interface 28 may be compliant, for example, with PCI, Ethernet, and/or InfiniBand.

The examples described with respect to FIG. 3 by no means limit the systems in which some embodiments of the present invention may be used. For example, some embodiments of the present invention may be used by the LXT 11001 and LXT 35401 transceiver products available from Intel Corporation.

Figure 4:
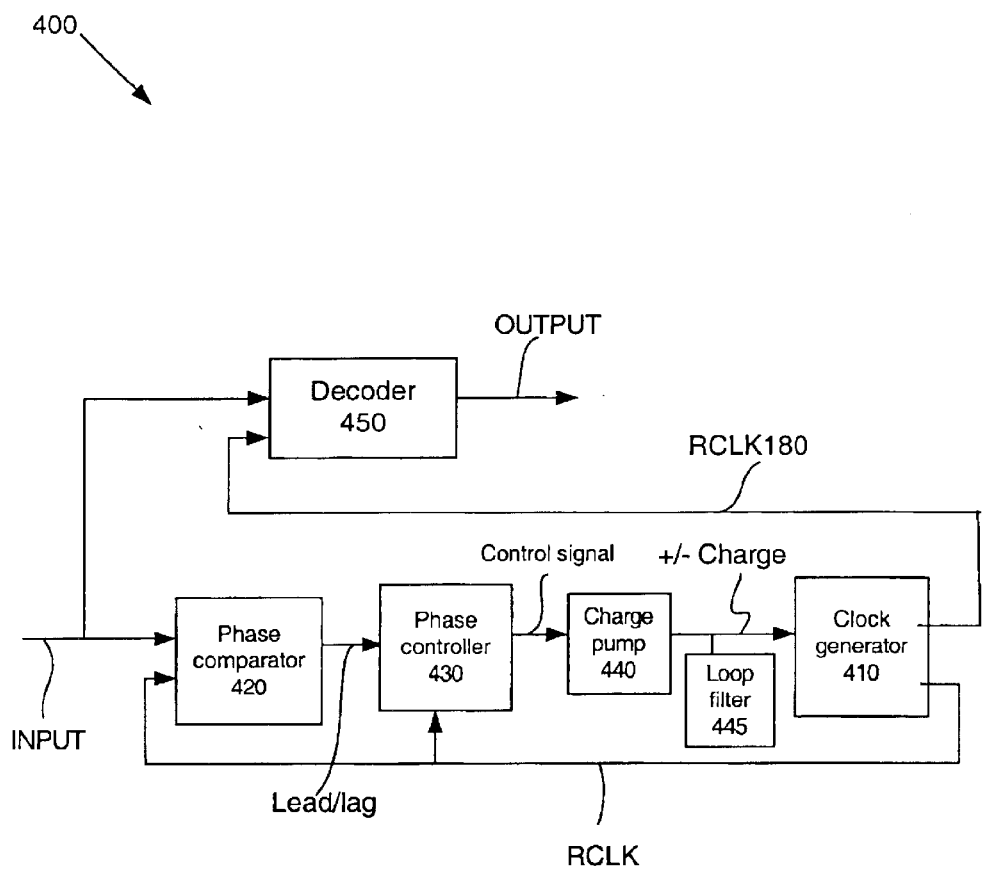
FIG. 4 depicts an example implementation of the present invention, in accordance with an embodiment of the present invention.

In accordance with an embodiment of the present invention, FIG. 4 depicts an example implementation of the present invention in re-timer system 400. Re-timer system 400 may include a clock generator 410, phase comparator 420, phase controller 430, charge pump 440, loop filter 445, and decoder 450. In one embodiment, phase controller 430 controls the amount that re-timer system 400 changes the phase of signal RCLK. For example, in one implementation, phase controller 430 may generate programmable duration UP and/or DN signals to control the magnitude of charge that charge pump 440 adds to or removes from the clock generator 410. Re-timer system 400 may be implemented as any of or a combination of: hardwired logic, software stored by a memory device and executed by a microprocessor, firmware, an application specific integrated circuit (ASIC), and/or a field programmable gate array (FPGA).

Figure 1:
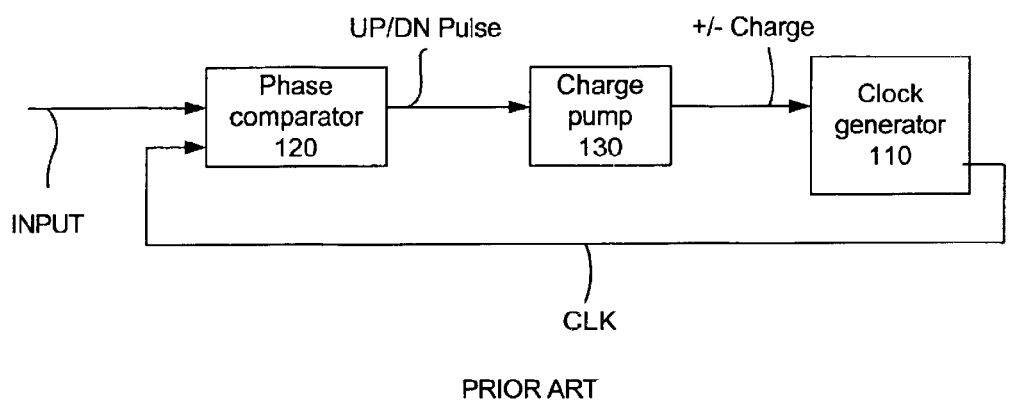
FIG. 1 depicts an example PLL device.
Figure 2:
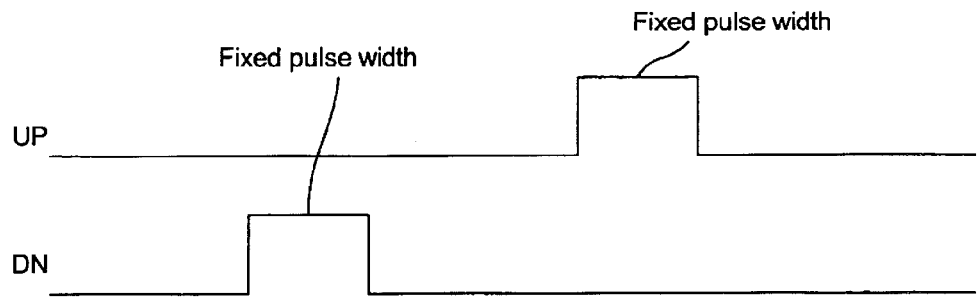
FIG. 2 depicts sample UP and DN pulses generated by a phase comparator.

One advantage of re-timer system 400 over the PLL described with respect to FIG. 1 may be that re-timer system 400 more accurately matches the phase of a clock signal with that of an input signal. Another advantage of re-timer system 400 may be that re-timer system 400 introduces less jitter into a phase adjusted clock signal than the PLL described with respect to FIG. 1. Another advantage may be that re-timer system 400 may be more adaptable for use in systems that use a charge pump with slow on-off speed and the charge pump is not able to output as small a level of current as desired.

Phase comparator 420 may indicate whether signal RCLK is leading or lagging signal INPUT. Phase comparator 420 may be implemented as an Alexander ("bang-bang") type filter. One implementation of an Alexander phase detector may be described, for example, in Electronic Letters by J. D. H. Alexander in an article entitled, Clock Recovery From Random Binary Signals, Volume 11, page 541-542, October 1975.

In accordance with an embodiment of the present invention, phase controller 430 may output to charge pump 440 programmable width UP and/or DN signals. Signal UP may correspond to a command to increase the frequency of the signal RCLK whereas signal DN may correspond to a command to decrease the frequency of the signal RCLK. In response to the UP and DN signals, charge pump 440 may respectively add charge to or remove charge from clock generator 410. The amount of charge added to or removed from the clock generator 410 may be proportional to the duration of (a) the active states of UP or DN signals or (b) the net difference in time between the active states of UP and DN signals.

In one implementation, every N bits of signal INPUT, phase controller 430 may output either (a) one UP or DN signal having an active state for the programmed width or (b) both the UP and DN signals in active states and the programmed width is the duration when only one of the UP or DN signals is active. The UP or/and DN signals may be used to control the speed-up and slow-down of the frequency of signal RCLK.

In response to the addition or removal of charge, clock generator 410 may respectively increase or decrease the frequency of the signal RCLK. Clock generator 410 may output clock signal RCLK and a 180 degree out-of-phase version of the signal RCLK (shown as RCLK180). In one implementation, clock generator 410 may be implemented as a voltage controlled oscillator. Clock signals RCLK and RCLK180 may have frequencies of either a full-rate (i.e., one cycle per bit of signal INPUT) or 1/X bit rate of signal INPUT, where X is an integer. In the case where signal RCLK has a frequency of 1/X the bit rate of signal INPUT, multiple versions of signal RCLK may be provided, where the phases of the versions are separated by one bit of signal INPUT. Similarly, in the case where signal RCLK180 has a frequency of 1/X the bit rate of signal INPUT, multiple versions of signal RCLK180 may be provided, where the phases of the versions are out-of-phase by one-half (½) bit to corresponding versions of RCLK. In this example, use of signals RCLK and RCLK 180 having frequencies of 1/X the bit rate of signal INPUT may allow the phase controller 430 to output UP and/or DN signals having widths in increments of less than one bit of signal INPUT.

In one implementation, a filter 445 may be used to control a frequency range over which charge pump 440 may change the charge content of clock generator 410. For example, filter 445 may implement a desired transfer function to convert the charge addition or removal from charge pump 440 to a VCO control voltage. The VCO control voltage may control the rate and range of speed changes of the clock signals output by the clock generator 410.

Figure 5:
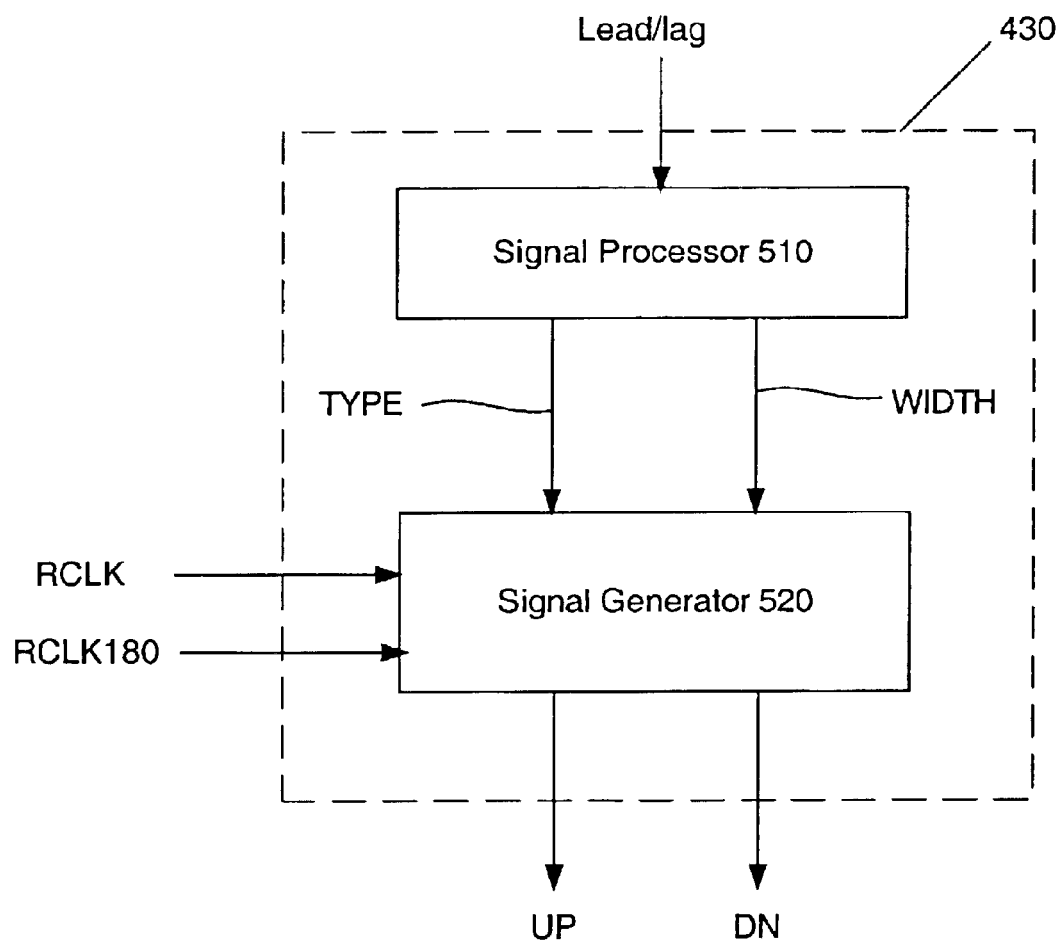
FIG. 5 depicts an example implementation of a phase controller, in accordance with an embodiment of the present invention.

FIG. 5 depicts an example implementation of phase controller 430 in accordance with an embodiment of the present invention. One embodiment of phase controller 430 may include a signal processor 510 and signal generator 520. Signal processor 510 may receive an integer N lead and/or lag indicators from phase comparator 420. Signal processor 510 may determine a type of phase control signal (e.g., UP and/or DN) (shown as TYPE) and the duration of the active state of such phase control signal (shown as WIDTH) for phase controller 430 to output. In accordance with an embodiment of the present invention, signal generator 520 may output to charge pump 440 UP and/or DN signals having TYPE and WIDTH parameters provided by signal processor 510. Signal generator 520 may use signals RCLK and RCLK180 in order to time the duration of UP and/or DN signals.

For example, in one implementation, phase controller 430 may use any integer number N of bits of signal INPUT to determine TYPE and WIDTH parameters. In one implementation, variable N is ten (10) although phase controller 430 may use other number of bits. Although one implementation of phase controller 430 has been described as using ten (10) bits of signal INPUT to program UP and/or DN signals, phase controller 430 may use less than ten (10) bits of signal INPUT or other number of bits that may be set according to desired performance and design requirements.

In accordance with an embodiment of the present invention, to determine TYPE and WIDTH parameters, one implementation of the phase controller 430 may use the variable "ratio" and relationships in the following table.

Variable ratio=2*(LAG/TRAN)−1, where

LAG=the number of times the signal RCLK lags the signal INPUT during the previous N bits of signal INPUT, and TRAN=total number of transitions of signal INPUT during the previous N bits of signal INPUT.

| Value of variable ratio | Type of signal (UP/DN) | Width of signal (bits of signal INPUT) |
| --- | --- | --- |
| 0 ≦ ratio < 0.2 | UP | 0 |
| 0.2 ≦ ratio < 0.6 | UP | ½ |
| Ratio ≧ 0.6 | UP | 1 |
| −0.2 < ratio < 0 | DN | 0 |
| −0.6 < ratio ≦ −0.2 | DN | ½ |
| Ratio ≦ −0.6 | DN | 1 |

The values provided in the preceding table are only one implementation and may be varied depending on desired design characteristics. In other implementations, the ratio may be determined by considering lead relationships or both lead and lag relationships.

Figure 6A:
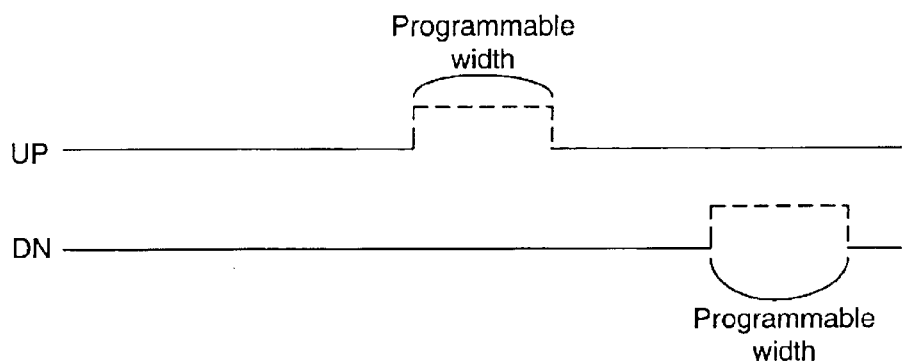
FIGS. 6A and 6B depict examples of control signals having programmable widths that a phase controller may output, in accordance with an embodiment of the present invention.
Figure 6B:
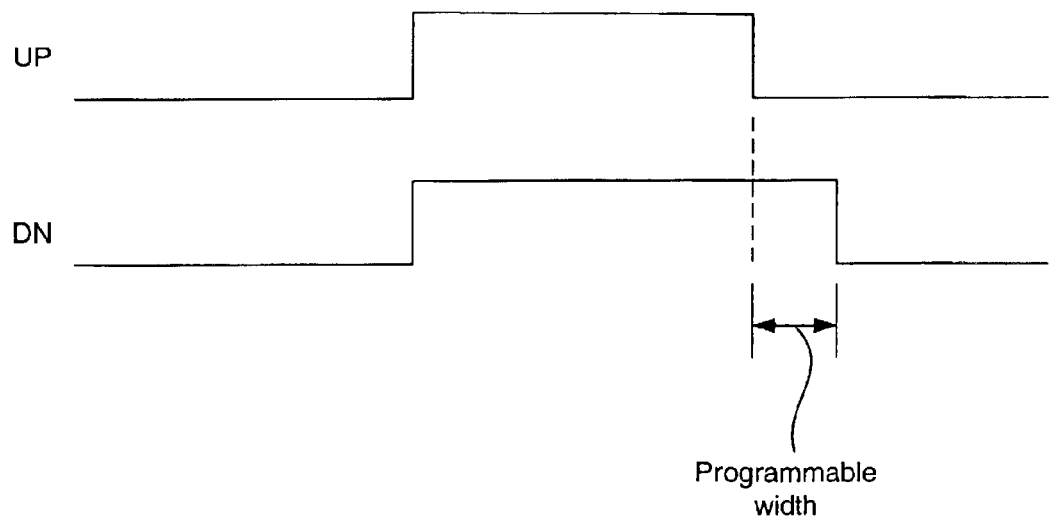

FIG. 6A depicts an example of UP and DN signals having programmable widths that phase controller 430 may output. In another implementation, phase controller 430 may output both the UP and DN signals in active states and the programmed width is the time when only one of the UP or DN signals is active. For example, FIG. 6B shows an example where the desired TYPE is DN and the WIDTH is the time when only the DN signal is active.

Decoder 450 may receive the signal INPUT and signal RCLK180. Decoder 450 may sample signal INPUT according to transitions of signal RCLK180 and output the sampled signal as signal OUTPUT. Signal OUTPUT may correspond to a regenerated version of signal INPUT.

Although some description has been made with respect to phase locked loops, the teachings provided herein can be applied to any situations where signal phases are compared and matched. For example, delay locked loops may use embodiments of the present invention. The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
   determining a phase amount to change a phase of a first signal based upon phases of N bits of a second signal, wherein N is an integer;
   selectively generating a phase control signal to control an amount to change the phase of the first signal in response to the phase amount, wherein
      the generating further comprises determining characteristics of the phase control signal,
      the characteristics comprise at least one of type or width parameters, the type consists of UP or DN, and
  a duration in which the phase control signal is in an active state is adjustable and based on the phase amount.

2. The method of claim 1, wherein the first signal comprises a clock signal.

3. The method of claim 1, wherein the second signal comprises a data signal.

4. The method of claim 1, wherein the determining characteristics further comprises determining a ratio of (a) number of times the first signal lags the second signal over (b) number of transitions of the second signal during N bits of the second signal.

5. The method of claim 4, wherein the ratio is defined by 2*(LAG/TRAN)−1, wherein
  LAG comprises a number of times the first signal lags the second signal during N bits of the second signal, and
  TRAN comprises a total number of transitions of the second signal during N bits of the second signal.

6. The method of claim 5, wherein the determining characteristics comprises determining at least one of type or width properties using a value of the ratio.

7. The method of claim 5, wherein the phase control signal comprises both UP and DN signals in an active state followed by a duration when only one of the UP or DN signals is in an active state and wherein the width comprises the duration when only one of the UP or DN signals is in an active state.

8. An apparatus comprising:
  a clock generator to generate a first signal;
  a phase comparator to receive the first signal and a second signal, and to provide an indication of phase relationship between the first signal and the second signal; and
  a phase controller to selectively provide a phase control signal to the clock generator to control an amount to change the phase of the first signal in response to the indication, wherein the phase control signal is based on phases of N bits of the second signal, wherein N is an integer, and wherein
    the phase controller is to determine at least one of type or width properties of the phase control signal,
    the type consists of UP or DN, and
    a duration of an active state of the phase control signal is adjustable and based on the indication.

9. The apparatus of claim 8, wherein the phase comparator comprises an Alexander type phase detector.

10. The apparatus of claim 8, wherein the first signal comprises a clock signal.

11. The apparatus of claim 8, wherein the second signal comprises a data signal.

12. The apparatus of claim 8, wherein the phase controller comprises:
  a signal processor to selectively determine type and width properties of the phase control signal in response to the indication; and
  a signal generator to provide the phase control signal based upon the type and width.

13. The apparatus of claim 12, wherein the signal processor comprises logic to determine the type and width based upon a ratio defined approximately by (a) a number of times the first signal lags the second signal over (b) number of transitions of the second signal during N bits of the second signal.

14. The apparatus of claim 12, wherein the signal processor is to determine the type and width by using a ratio and wherein the ratio is approximately defined by 2*(LAG/TRAN)−1, wherein
  LAG comprises a number of times the first signal lags the second signal during N bits of the second signal, and
  TRAN comprises a total number of transitions of the second signal during N bits of the second signal.

15. The apparatus of claim 14, wherein the signal processor is to determine type and width depending at least on a value of the ratio.

16. The apparatus of claim 14, wherein the phase control signal comprises both UP and DN signals in an active state followed by a duration when only one of the UP or DN signals is in an active state and wherein the width comprises the duration when only one of the UP or DN signals is in an active state.

* * * * *